(12) United States Patent
Kim et al.

(10) Patent No.: US 9,093,610 B2
(45) Date of Patent: Jul. 28, 2015

(54) DISPLAY APPARATUS AND METHOD OF MANUFACTURING THE SAME

(71) Applicant: Samsung Display Co., Ltd., Yongin (KR)

(72) Inventors: Young Gu Kim, Hwaseong-si (KR); Byoung-Hun Sung, Hwaseong-si (KR); Baekkyun Jeon, Yongin-si (KR); Jin-Soo Jung, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/684,847

(22) Filed: Nov. 26, 2012

(65) Prior Publication Data

US 2013/0334543 A1 Dec. 19, 2013

(30) Foreign Application Priority Data

Jun. 15, 2012 (KR) ........................ 10-2012-0064218

(51) Int. Cl.

| H01L 33/36 | (2010.01) |
|---|---|
| H01L 33/00 | (2010.01) |
| H01L 27/12 | (2006.01) |
| H01L 27/32 | (2006.01) |
| G02F 1/1345 | (2006.01) |
| H01L 51/52 | (2006.01) |

(52) U.S. Cl.
CPC ............ *H01L 33/36* (2013.01); *G02F 1/13454* (2013.01); *H01L 27/1218* (2013.01); *H01L 27/3276* (2013.01); *H01L 33/005* (2013.01); *H01L 51/52* (2013.01)

(58) Field of Classification Search
CPC ................... G09G 2300/0426; G09G 3/3666; G02F 1/13545; G02F 1/12454; H01L 21/76838

USPC ............................ 257/79; 349/139; 345/55, 56
See application file for complete search history.

(56) References Cited

U.S. PATENT DOCUMENTS

| 5,219,787 | A * | 6/1993 | Carey et al. ................... 438/637 |
|---|---|---|---|
| 6,627,485 | B2 | 9/2003 | Murade |
| 6,784,951 | B2 | 8/2004 | Kuroki et al. |
| 6,897,841 | B2 | 5/2005 | Ino |
| 7,394,514 | B2 | 7/2008 | Hayashi et al. |
| 7,477,230 | B2 | 1/2009 | Shiota et al. |
| 7,477,338 | B2 | 1/2009 | Aramatsu |
| 7,524,689 | B2 | 4/2009 | Kato et al. |
| 2006/0208993 | A1* | 9/2006 | Jung ................................ 345/98 |
| 2008/0284765 | A1 | 11/2008 | Kim |
| 2009/0184946 | A1* | 7/2009 | Ahn et al. ...................... 345/206 |

(Continued)

FOREIGN PATENT DOCUMENTS

| JP | 2007-139967 | 6/2007 |
|---|---|---|
| JP | 2007-264447 | 10/2007 |
| KR | 10-2004-0034744 | 4/2004 |

(Continued)

*Primary Examiner* — Matthew Reames
*Assistant Examiner* — John Bodnar
(74) *Attorney, Agent, or Firm* — H.C. Park & Associates, PLC (57) ABSTRACT

A display apparatus includes a display panel, a gate driver, and a data driver. The display panel includes a display area in which an image is displayed and a non-display area disposed adjacent to the display area. The display panel includes an insulating substrate which has a groove. The gate driver is disposed to overlap with the display area when viewed in a plan view. At least part of the gate driver is formed on the groove.

10 Claims, 10 Drawing Sheets

(56) References Cited

U.S. PATENT DOCUMENTS

| | | |
|---|---|---|
| 2011/0291553 A1 | 12/2011 | Moon |
| 2011/0302815 A1 | 12/2011 | Huang et al. |
| 2011/0303917 A1* | 12/2011 | Lee et al. .................. 257/59 |
| 2011/0310545 A1 | 12/2011 | Liu |
| 2011/0316807 A1 | 12/2011 | Corrion |
| 2012/0013818 A1 | 1/2012 | Park et al. |

FOREIGN PATENT DOCUMENTS

| | | |
|---|---|---|
| KR | 10-2005-0000447 | 1/2005 |
| KR | 10-2009-0114505 | 11/2009 |
| KR | 10-1010344 | 1/2011 |

* cited by examiner

DISPLAY APPARATUS AND METHOD OF MANUFACTURING THE SAME

CROSS-REFERENCE TO RELATED APPLICATION

This application claims priority Korean Patent Application No. 10-2012-0064218, filed on Jun. 15, 2012, the contents of which are hereby incorporated by reference.

BACKGROUND

1. Field of Disclosure

The present disclosure relates to a display apparatus and a method of manufacturing of the same. More particularly, the present disclosure relates to a display apparatus capable of reducing a size of a non-display area thereof and a method of manufacturing the display apparatus.

2. Background of the Invention

Recently, various display apparatuses, such as a liquid crystal display, an electrophoretic display, an organic light emitting display, etc., have been continuously developed.

The display apparatus includes a display panel, a gate driver, and a data driver. The display panel includes a display area in which an image is displayed and a non-display area adjacent to the display area. In addition, the display panel further includes a gate line, a data line, and a pixel connected to the gate line and the data line.

The gate driver may be mounted on a printed circuit board that is electrically connected to the display panel in a chip form or may be directly formed in the non-display area of the display panel through a thin film process so as to apply a gate signal to the gate line.

In the case that the gate driver is mounted on the printed circuit board, the display panel includes a pad part for the connection with the gate driver. The pad part is disposed in the non-display area, thereby causing an increase in size of the non-display area.

In addition, when the gate driver is directly formed in the non-display area, the non-display area exceeds a certain size in order to perform the thin film process for the gate driver.

SUMMARY

The present disclosure provides a display apparatus capable of reducing a size of a non-display area thereof without loss of light transmittance.

The present disclosure provides a method of manufacturing the display apparatus.

Exemplary embodiments of the present invention provide a display apparatus includes a display panel, a gate driver, and a data driver. The display panel includes a pixel, a gate line extended in a first direction, and a data line extended in a second direction crossing the first direction and includes a display area in which an image is displayed and a non-display area disposed adjacent to the display area.

The gate driver is disposed to overlap with the display area when viewed in a plan view and applies a gate signal to the gate line. The data driver applies a data signal to the data line.

The display panel further includes an insulating substrate and an insulating planarization layer. The insulating substrate includes a groove overlapped with the display area when viewed in a plan view. The gate driver includes a stage part disposed on the groove and an output part connected to the stage part and extended outwardly from the groove in the first direction. The insulating planarization layer is disposed on the insulating substrate to correspond to the groove.

At least a portion of the gate driver is disposed between the insulating substrate and the insulating planarization layer. The gate driver is substantially transparent.

The display panel further includes a first electrode, a second electrode, an image display layer, and a protective layer.

The first electrode is disposed on the insulating substrate, the gate driver, and the insulating planarization layer.

The second electrode is disposed on the first electrode to be insulated from the first electrode and defines a tunnel-shaped cavity between the first electrode and the second electrode.

The image display layer is disposed in the tunnel-shaped cavity and controlled by an electric field generated by the first electrode and the second electrode.

The protective layer covers the second electrode and seals the tunnel-shaped cavity.

Embodiments of the inventive concept provide a method of manufacturing a display apparatus is provided as follows. When an insulating substrate is etched to form a groove, a gate driver is formed in an area corresponding to the groove and an area disposed outside of the groove. Then, an insulating planarization layer is formed on the gate driver to correspond to the groove. After that, a first electrode, a sacrificial layer, and a second electrode are formed. Then, the sacrificial layer is removed to form a tunnel-shaped cavity and an image display part is formed in the tunnel-shaped cavity. Next, a protective layer is formed to seal the tunnel-shaped cavity.

According to the above, the gate driver is disposed to overlap with the display area of the display panel, so that the non-display area is reduced in size. In addition, since the gate driver is substantially transparent, the transmittance of the light passing through the gate driver is not lowered.

Further, the display panel of the display apparatus is configured to include one insulating substrate, and thus no sealant is required, thereby reducing the non-display area in size.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE ILLUSTRATED EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiment of the present invention will be explained in detail with reference to the accompanying drawings.

Figure 1:
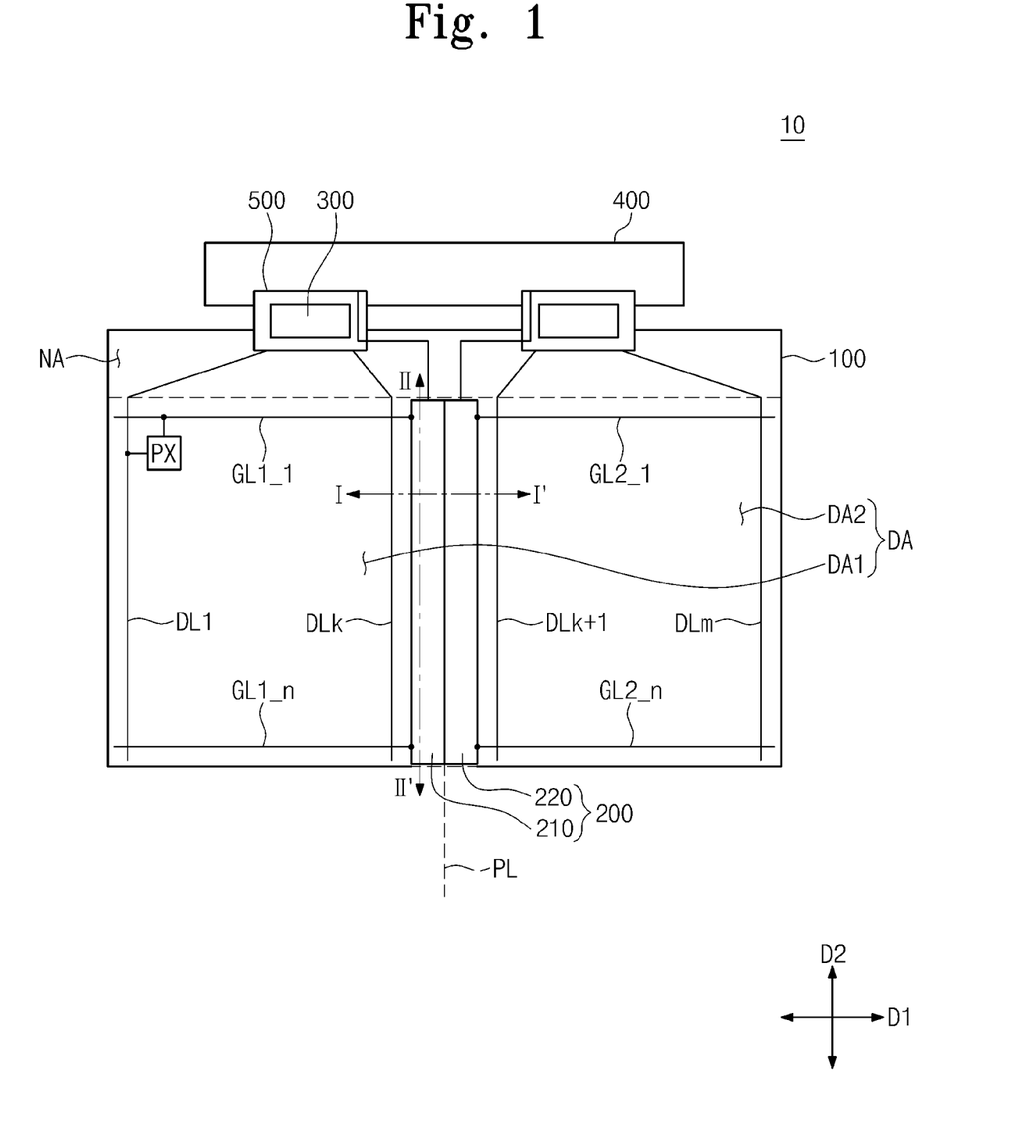
FIG. 1 is a plan view showing a display apparatus according to an exemplary embodiment of the present invention.

FIG. 1 is a plan view showing a display apparatus according to an exemplary embodiment of the present invention.

Referring to FIG. 1, the display apparatus 10 includes a display panel 100, a gate driver 200, and a data driver 300.

The display panel 100 includes a display area DA in which an image is displayed and a non-display area NA disposed adjacent to at least a portion of the display area DA. The display area DA includes a first display area DA1 and a second display area DA2. The first display area DA1 and the second display area DA2 may be separated from each other with reference to a boundary line substantially parallel to a second direction D2. The first display area DA1 and the second display area DA2 may have the same area. The non-display area NA, in which the image is not displayed, is disposed adjacent to an upper portion of the display area DA, but it should not be limited thereto or thereby. That is, the non-display area NA may be disposed to one side of the display area DA.

The display panel 100 includes a plurality of gate lines receiving a gate signal and a plurality of data lines DL1 to DLm receiving a data voltage. The gate lines extend substantially in parallel to the first direction D1 and the data lines DL1 to DLm extend substantially in parallel to the second direction D2. The gate lines are insulated from the data lines DL1 to DLm while crossing the data lines DL1 to DLm.

The gate lines include first gate lines GL1_1 to GL1-$n$ and second gate lines GL2_1 to GL2-$n$. The first gate lines GL1_1 to GL1_$n$ are disposed in the first display area DA1 and the second gate lines GL2_1 to GL2_$n$ are disposed in the second display area DA2. The first gate lines GL1_1 to GL1_$n$ may be separated from and have the same length as the second gate lines GL2_1 to GL2_$n$ in the first direction D1.

The display panel 100 includes a plurality of pixel areas defined by the gate lines GL1_1 to GL1_$n$ and GL2_1 to GL2_$n$ and arranged in a matrix configuration, and pixels are arranged in the pixel areas, respectively. FIG. 1 shows one pixel PX as a representative example. The pixel PX may be a part of the display panel 100 corresponding to one pixel area in three-dimension.

The pixel PX includes a thin film transistor (not shown), a first electrode connected to the thin film transistor, a second electrode applied with a common voltage, and a portion of an image display layer disposed between the first electrode and the second electrode.

The thin film transistor includes a gate electrode, a source electrode, and a drain electrode. The gate electrode is connected to a first first gate line GL1_1 to receive the gate signal. The source electrode is connected to a first data line DL1 to receive the data voltage. The drain electrode is connected to the first electrode. The thin film transistor applies the data voltage to the first electrode in response to the gate signal.

The display apparatus 10 may further include a printed circuit board 400 and a tape carrier package 500.

A timing controller (not shown) is disposed on the printed circuit board 400.

Although not shown in FIG. 1, the timing controller receives a control signal from an external source (not shown) to generate a gate control signal and a data control signal. The timing controller applies the gate control signal to the gate driver 200 and the data control signal to the data driver 300. In addition, the timing controller receives image data from the external source and provides the image data to the data driver 300.

The gate control signal includes a vertical start signal that starts an operation of the gate driver 200 and a gate clock signal that determines an output timing of the gate signal.

The data control signal includes a horizontal start signal that starts an operation of the data driver 300, a polarity inversion signal that controls a polarity of the data voltage output from the data driver 300, and a load signal that determines an output timing of the data voltage.

The tape carrier package 500 is electrically connected between the display panel 100 and the printed circuit board 400.

The gate driver 200 is disposed to overlap with the display area DA when viewed in a plan view. The gate driver 200 includes a first gate driver 210 and a second gate driver 220.

The gate driver 200 is disposed at a center portion of the display area DA and extended in the second direction D2 so as to be overlapped with a portion of the first display area DA1 and a portion of the second display area DA2. In this case, the first gate driver 210 is disposed to overlap with the first display area DA1 and the second gate driver 220 is disposed to overlap with the second display area DA2.

The gate driver 200 outputs the gate signal to the gate lines GL1_1 to GL1_*n* and GL2_1 to GL2_*n*. The first gate driver 210 is electrically connected to ends of the first gate lines GL1_1 to GL1_*n* and generates a first gate signal to sequentially apply the first gate signal to the first gate lines GL1_1 to GL1_*n*. The second gate driver 220 is electrically connected to ends of the second gate lines GL2_1 to GL2_*n* and generates a second gate signal to sequentially apply the second gate signal to the second gate lines GL2_1 to GL2_*n*. In this case, the ends of the first gate lines GL1_1 to GL1_*n* face the ends of the second gate lines GL2_1 to GL2_*n*, is respectively.

The first gate driver 210 and the second gate driver 220 drive the first gate lines GL1_1 to GL1_*n* and the second gate lines GL2_1 to GL2_*n*, respectively, on the basis of the same gate control signal. That is, the first gate signal and the second gate signal are substantially the same except for directions in which the first and second gate signals are respectively directed. For instance, when the first gate signal is applied to the first first gate line GL1_1, the second gate signal may be applied to a first second gate line GL2_1. Then, when the first gate signal is applied to a second first gate line GL1_2, the second gate signal may be applied to a second second gate line GL2_2. Thus, the first gate lines GL1_1 to GL1_*n* and the second gate lines GL2_1 to GL2_*n* may be symmetrically driven with each other by the first gate driver 210 and the second gate driver 220.

The data driver 300 may be mounted on the tape carrier package 500 in the form of a chip. The data driver 300 is electrically connected to the data lines DL1 to DL*m* to apply the data voltage to the data lines DL1 to DL*m*. The data driver 300 converts the image data from the timing controller (not shown) into the data voltage, which is an analog signal, based on gamma voltages from a gamma voltage generator (not shown).

Figure 2:
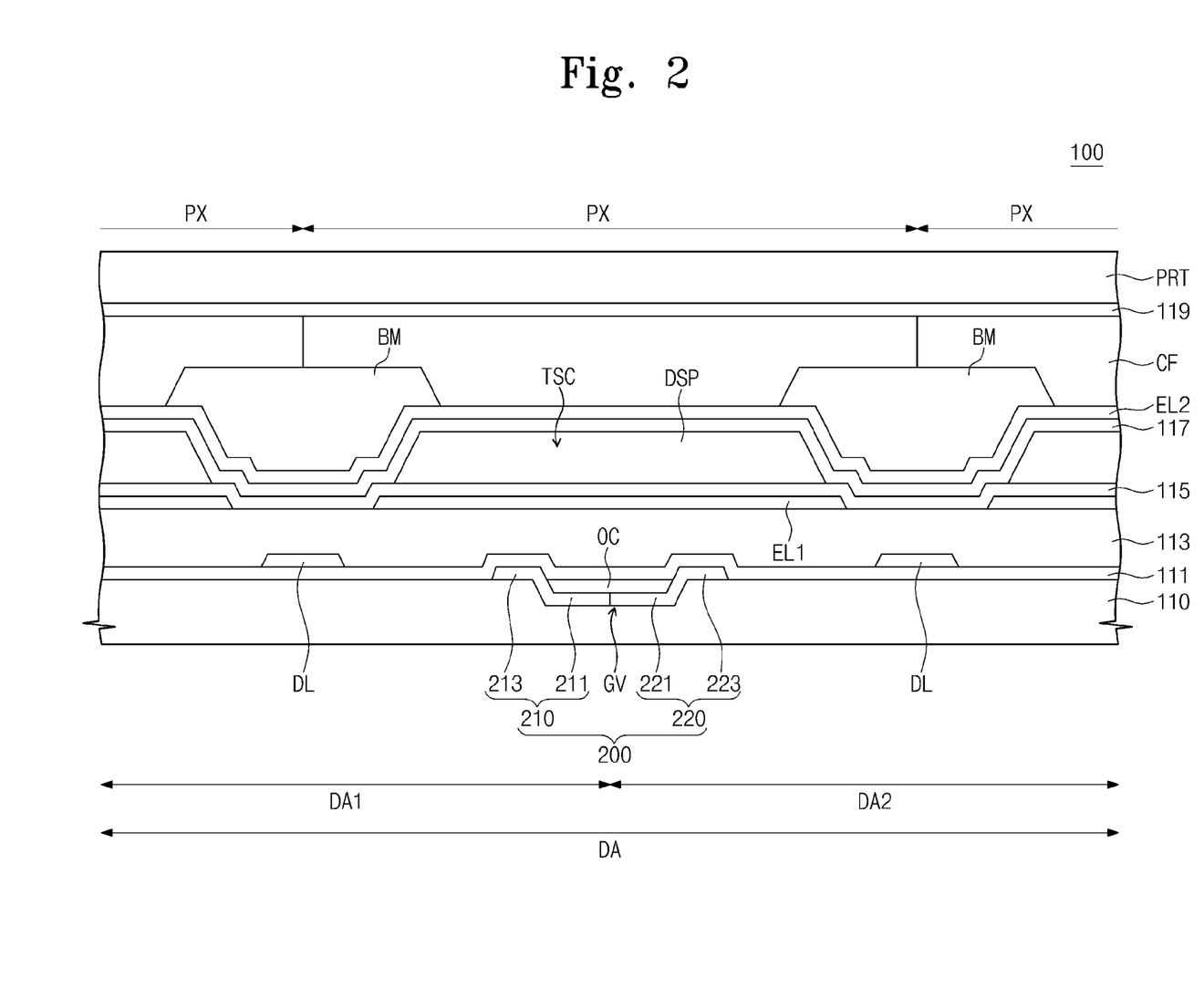
FIG. 2 is a cross-sectional view taken along a line I-I' of FIG. 1.
Figure 3:
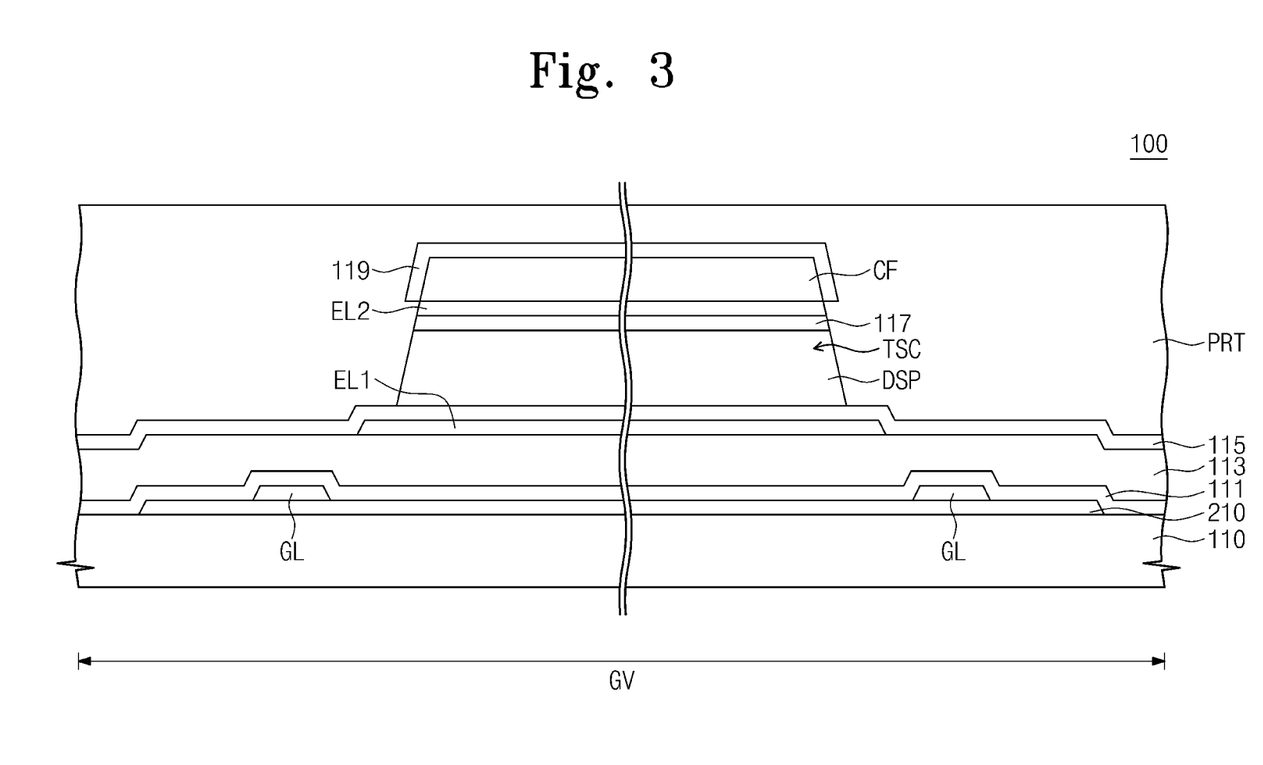
FIG. 3 is a cross-sectional view taken along a line II-II' of FIG. 1.

FIG. 2 is a cross-sectional view taken along a line I-I' of FIG. 1 and FIG. 3 is a cross-sectional view taken along a line II-II' of FIG. 1. Hereinafter, the display panel 100 and the gate driver 200 will be described in detail with reference to FIG. 1, FIG. 2 and FIG. 3.

The display panel 100 further includes an insulating substrate 110, first to fifth insulating layers 111, 113, 115, 117, and 119, a color filter CF, a black matrix BM, and a protective layer PRT.

The insulating substrate 110 may be formed of a transparent insulating material. The insulating substrate 110 includes a groove GV. The groove GV is overlapped with a portion of the display area DA when viewed in a plan view. In detail, the groove GV is disposed at a center portion of the display area DA to overlap with the portion of the first display area DA1 and the portion of the second display area DA2. The groove GV has a predetermined depth and is extended in the second direction D2 when viewed in a plan view.

The gate driver 200 is disposed on the insulating layer 110 to correspond to the groove GV.

The gate driver 200 includes a stage part and an output part. The first gate driver 210 includes a first stage part 211 and a first output part 213, and the second gate driver 220 includes a second stage part 221 and a second output part 223.

The first stage part 211 is disposed on a left side of the groove GV, e.g., a left bottom surface and a left inner wall surface of the groove GV, with respect to a center of the groove GV in the first direction D1. The first output part 213 is connected to the first stage 211 and extended outwardly in the first direction D1 from the first stage 211, but it should not be limited thereto or thereby. That is, the first stage part 211 and the first output part 213 may be integrally formed with each other.

The first gate lines GL1_1 to GL1_*n* are disposed on the first output part 213 and electrically connected to the first output part 213. The first output part 213 may be, but not limited to, wires.

The second stage part 221 and the second output part 223 have the substantially same structure as those of the first stage part 211 and the first output part 213 except that the second stage part 221 and the second output part 223 are disposed on a right side of the groove GV with respect to the center of the groove GV in the first direction D1.

The gate driver 200 may be substantially transparent. The gate driver 200 includes a transparent electrode. In detail, the transparent electrode may be, but not limited to, a carbon nano-tube or a graphene. The gate driver 200 is overlapped with the display area DA, but a transmittance of light passing through the gate drive 200 is not lowered since the gate driver 200 employs a transparent electrode.

The display panel 100 further includes an insulating planarization layer OC.

The insulating planarization layer OC faces the insulating substrate 110 while interposing the gate driver 200 therebetween. In detail, the insulating planarization layer OC is disposed on the first stage part 211 and the second stage part 221 to cover the first stage part 211 and the second stage part 221 when viewed in a plan view.

The insulating planarization layer OC has a thickness equal to or greater than about 3 micrometers, and the depth of the groove GV is greater than 3 micrometers. The insulating planarization layer OC, which has the thickness of at least approximately 3 micrometers, may prevent occurrence of parasitic capacitance between electrodes in the gate driver 200 and the other electrodes in the display panel 100.

In addition, the insulating planarization layer OC planarizes an upper surface of the insulating substrate 110, in which a step-difference occurs by the groove GV and the gate driver 200.

The insulating planarization layer OC may include an organic layer.

The gate lines GL1_1 to GL1_*n* and GL2_1 to GL2_*n*, the data lines DL1 to DL*m*, and the thin film transistor (not shown) are disposed on the insulating substrate 110, the gate driver 200, and the insulating planarization layer OC. FIGS. 2 and 3 show two gate lines GL and two data lines DL as an example.

The first insulating layer 111 is disposed between the gate line GL and the data line DL to insulate the gate line GL and the data line DL from each other.

The second insulating layer 113 covers the data lines DL and the thin film transistor. The second insulating layer 113 is provided with a contact hole (not shown) formed therethrough to expose a portion of the drain electrode (not shown).

The first electrode EL1 is disposed on the second insulating layer 113 and connected to the drain electrode through the contact hole. The first electrode EL1 is arranged in each pixel PX. The first electrode EL1 has a rectangular shape when viewed in a plan view, but it should not be limited to the rectangular shape. That is, the first electrode EL1 may includes various shares, such as a trunk portion and a branch portion protruded from the trunk portion.

The second electrode EL2 forms an electric field between the first electrode EL1 and the second electrode EL2 in cooperation with the first electrode EL1. The second electrode EL2 is partially spaced apart from the third insulating layer 115, and thus a tunnel-shaped cavity TSC is defined between the third insulating layer 115 and the second electrode EL2.

In the present exemplary embodiment, the third insulating layer 115 is disposed on the first electrode EL1 to protect the first electrode EL1. The fourth insulating layer 117 is disposed under the second electrode EL2 to protect the second electrode EL2. Due to the third insulating layer 115 and the fourth insulating layer 117, the first electrode EL1 and the second electrode EL2 are insulated from each other. Thus, the tunnel-shaped cavity TSC is provided between the third insulating layer 115 and the fourth insulating layer 117.

An image display part DSP is disposed in the tunnel-shaped cavity TSC defined between the first electrode EL1 and the second electrode EL2.

The image display part DSP is controlled by the electric field to display the image. The image display part DSP may be, but not limited to, an electrophoretic layer or a liquid crystal layer.

When the image display part DSP is the electrophoretic layer, the electrophoretic layer includes an insulating medium and charged particles. The insulating medium corresponds to a dispersive medium in a system in which the charged particles are dispersed. The charged particles are dispersed in the insulating medium to show electrophoretic property. The charged particles move according to the electric field to transmit or block the light passing through the electrophoretic layer, thereby displaying the image.

When the image display part DSP is the liquid crystal layer, the liquid crystal layer includes liquid crystal molecules with an optical anisotropy. The liquid crystal molecules are operated by the electric field to transmit or block the light passing through the liquid crystal layer, to thereby display the image.

In the present exemplary embodiment, the liquid crystal layer will be described in detail as the image display part DSP.

When the image display part DSP is the liquid crystal layer, alignment layers (not shown) are respectively disposed on an upper surface of the third insulating layer 115 and a lower surface of the fourth insulating layer 117 in the tunnel-shaped cavity TSC. The alignment layers are used to pre-tilt the liquid crystal molecules in the liquid crystal layer. The protective layer PRT is disposed on the second electrode EL2 while interposing the color filter CF, the black matrix BM, and the fifth insulating layer 119.

The color filter CF covers the second electrode EL2. The light passing through the image display part DSP has a specific color by the color filter CF. The color filter CF is provided in a plural number, and the color filters CF include a red color filter R, a green color filter G, and a blue color filter B. The color filters CF are arranged to correspond to the pixels PX, respectively.

The black matrix BM is disposed on the second electrode EL2, but it should not be limited thereto or thereby. That is, the black matrix BM may be disposed under the second electrode EL2. In this case, the black matrix BM is disposed between the fourth insulating layer 117 and the second electrode EL2. FIG. 2 shows the black matrix BM disposed on the second electrode EL2 as an example. The black matrix BM is disposed at an edge of the pixel PX. The black matrix BM is overlapped with the data line DL, the gate line GL, and the thin film transistor (not shown).

The black matrix BM blocks a portion of the light that is unnecessary to realize the image. For instance, the black matrix BM prevents unwanted light from leaking from the edge of the image display part DSP, which is caused by the liquid crystal molecules, or the colors of the color filters CF from mixing with each other.

The fifth insulating layer 119 completely covers the color filter CF. Both side surfaces of the color filter CF in the second direction D2 are covered by the fifth insulating layer 119.

The protective layer PRT covers the entire surface of the insulating substrate 110 on which various parts including the fifth insulating layer 119 are formed. The protective layer PRT seals the tunnel-shaped cavity TSC by closing the opening of the tunnel-shaped cavity TSC. That is, the first electrode EL1, the second electrode EL2, and the protective layer PRT define and seal the tunnel-shaped cavity TSC.

Although not shown in figures, when the liquid crystal layer is used as the image display part DSP, polarizing plates are respectively disposed on a rear surface of the insulating substrate 110 and on the protective layer PRT. When assuming that the polarizing plate disposed on the rear surface of the insulating substrate 110 is referred to as a first polarizing plate and the polarizing plate disposed on the protective layer PRT is referred to as a second polarizing plate, the first polarizing plate has a polarizing axis substantially perpendicular to a polarizing axis of the second polarizing plate, and thus the light passing through the first polarizing plate is vertically polarized with respect to the light passing through the second polarizing plate.

In a conventional display apparatus, a display panel includes two insulating substrates facing each other and the two insulating substrates are coupled with each other and sealed using sealant. The sealant is provided along an edge of the display panel. Due to the area of the sealant and a process margin for the sealant, a non-display area is presented in the edge of the display panel. However, according to the present exemplary embodiment, the display panel needs to include one insulating substrate 110, and thus no sealant is required. Consequently, the non-display area of the display apparatus may be reduced.

In addition, the gate driver 200 is disposed to overlap with the display area DA of the display apparatus. Accordingly, the non-display area may be more reduced than when the gate driver 200 is disposed in the non-display area NA of the display apparatus.

Figure 4A:
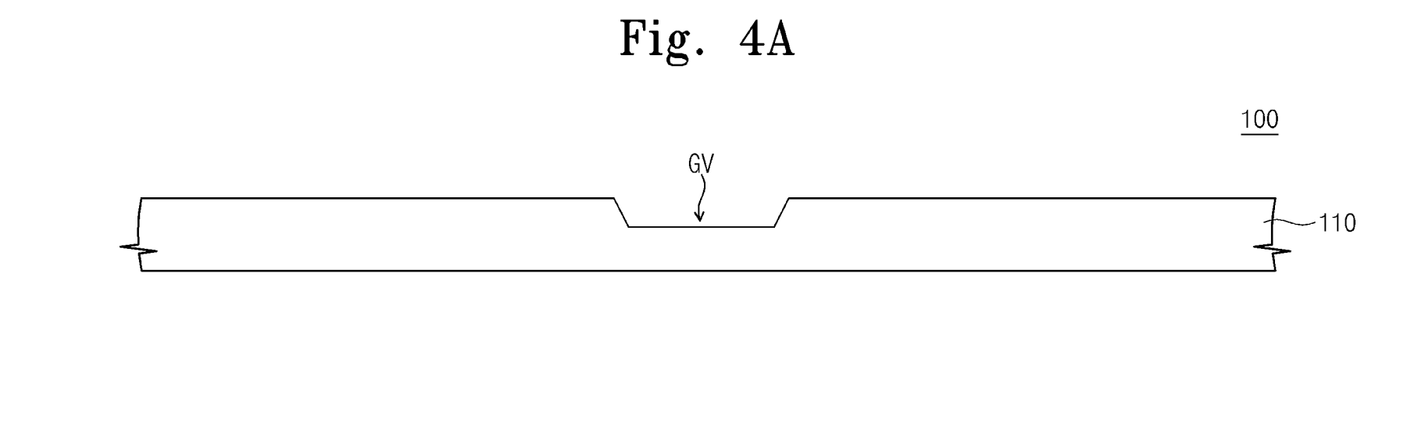
FIGS. 4A, 4B, 4C, 4D, 4E, and 4F are cross-sectional views explaining a method of manufacturing a display apparatus according to an exemplary embodiment of the present invention.
Figure 4B:
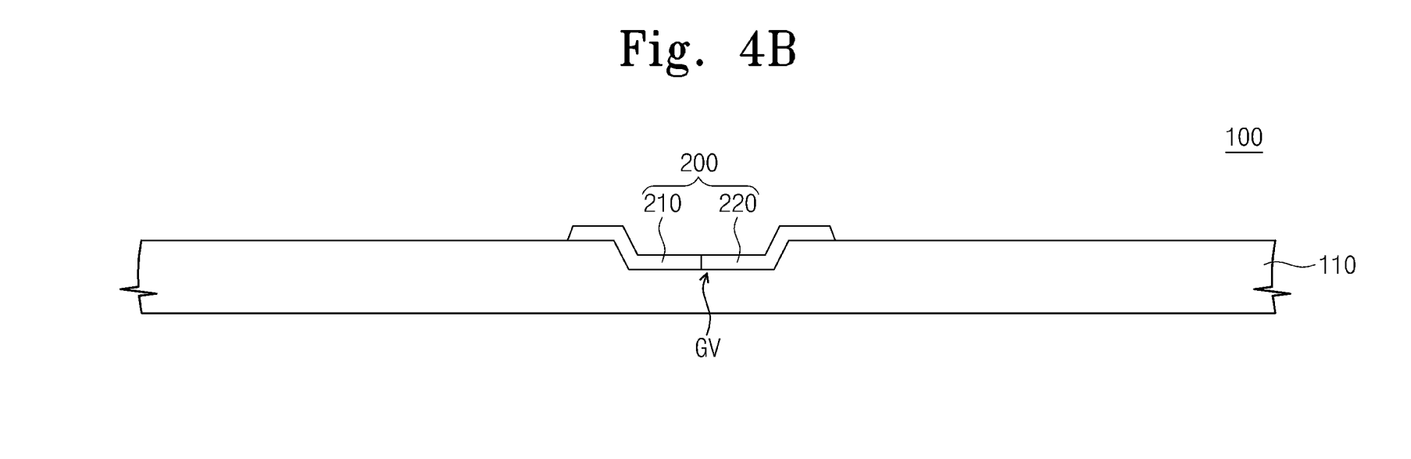
Figure 4C:
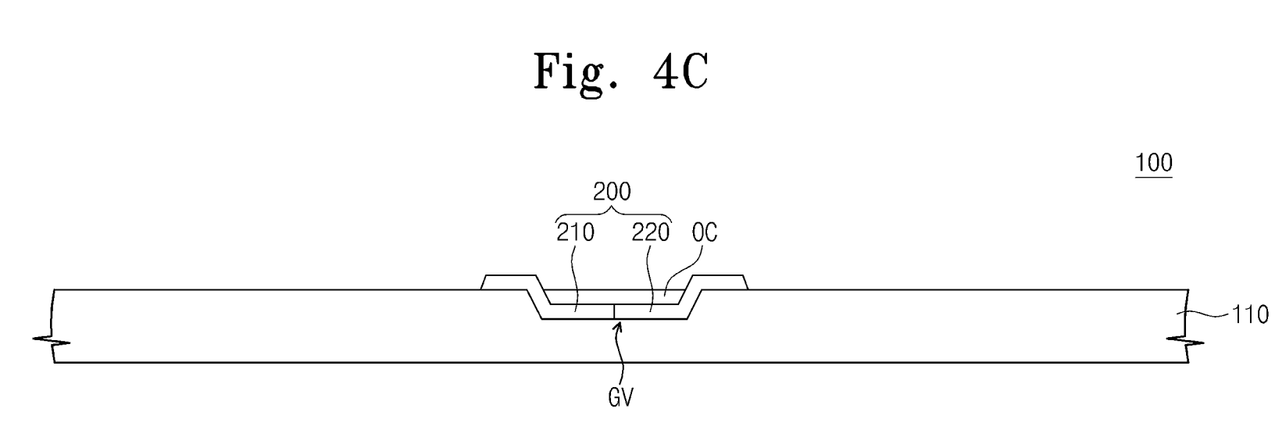
Figure 4D:
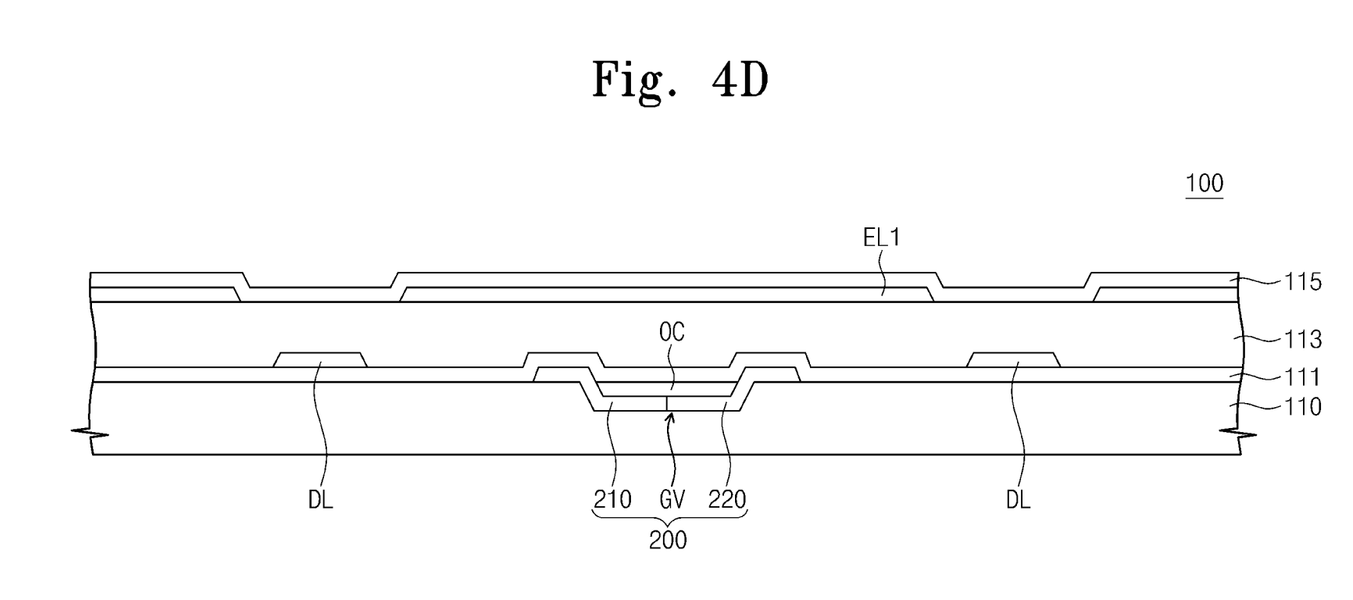
Figure 4E:
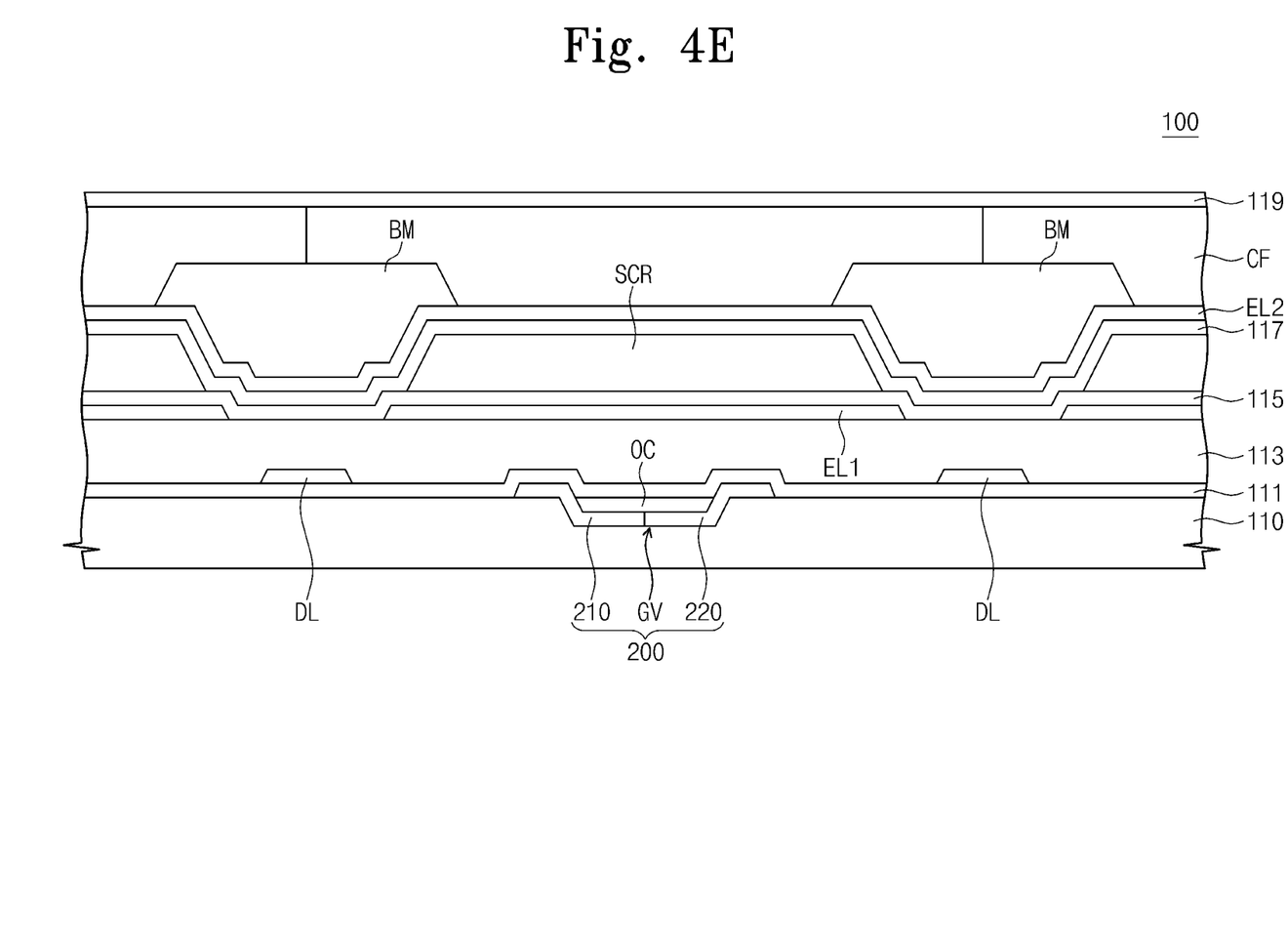
Figure 4F:
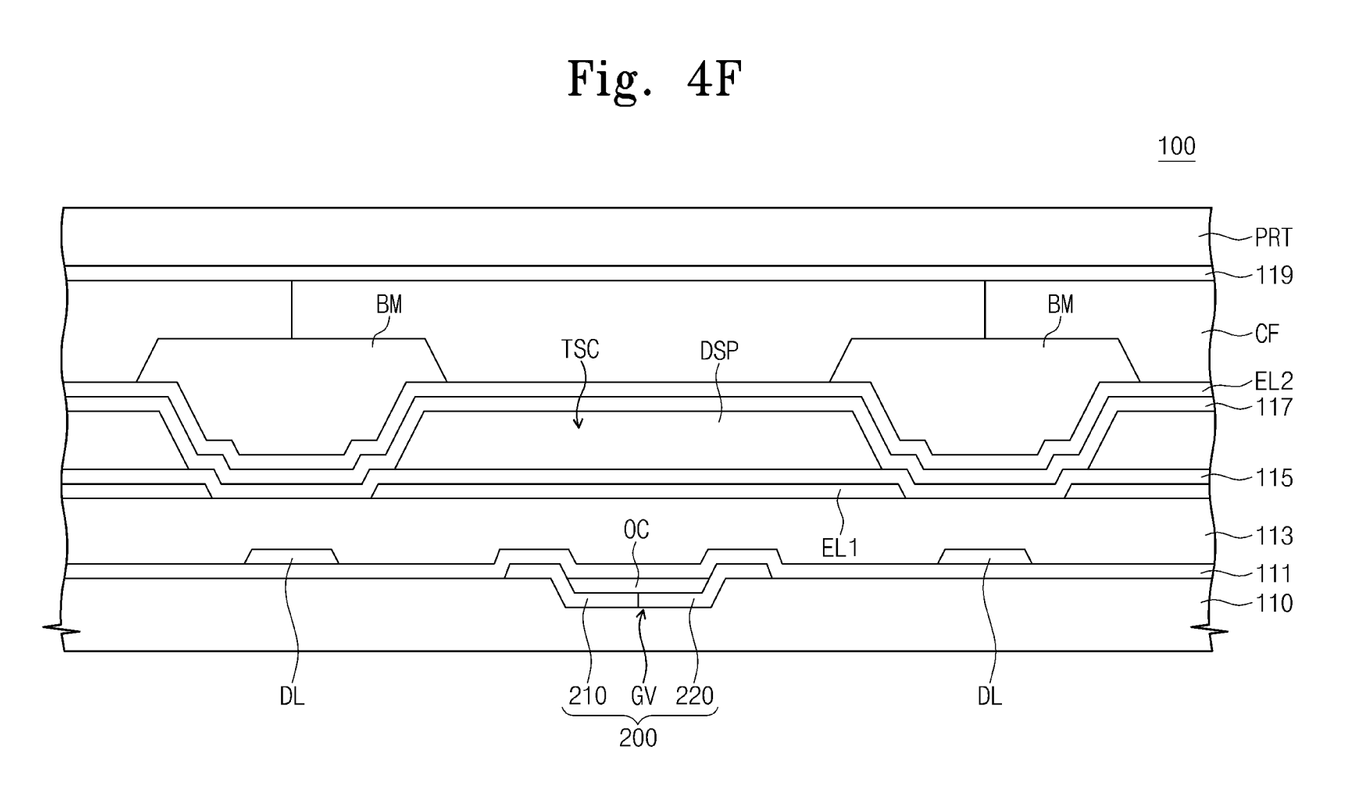

FIGS. 4A and 4F are cross-sectional views explaining a method of manufacturing a display apparatus according to an exemplary embodiment of the present invention.

Referring to FIGS. 1 and 4A, the groove GV is formed in the insulating substrate 110.

The groove GV may be formed using any suitable process. For example, the groove GV may be formed by partially etching the insulating substrate 110 using one mask. In this case, the depth of the groove GV is adjusted by controlling a concentration of etchant or a moving speed of spray that sprays the etchant. The groove GV is formed in the center portion of the insulating substrate 110 to be substantially parallel to the second direction.

Referring to FIG. 4B, the gate driver 200 is formed on the insulating substrate 110 in which the groove GV is formed. The gate driver 200 is formed to overlap with the groove GV and a predetermined area of the insulating substrate 110, which is adjacent to the groove GV.

The first gate driver 210 and the second gate driver 220 of the gate driver 200 may be formed separately from each other.

The gate driver 200 is formed through the thin film process repeated several times. In FIG. 4B, the gate driver 200 is shown to have a single-layer structure, but the gate driver 200 includes the electrodes and the insulating layers. In this case, the electrodes of the gate driver 200 may be transparent electrodes, e.g., carbon nano-tube or graphene.

Referring to FIG. 4C, the insulating planarization layer OC is formed on the insulating substrate 110 on which the gate driver 200 is formed. The insulating planarization layer OC is formed on the gate driver 200 corresponding to the groove GV. The insulating planarization layer OC is formed by depositing an organic material using one mask.

Referring to FIG. 4D, the gate line (not shown), the data lines DL, and the thin film transistor (not shown) are formed on the insulating substrate 110 on which the gate driver 200 and the insulating planarization layer OC are formed. The first insulating layer 111 is formed between the gate line and the data lines DL, and the second insulating layer 113 is formed on the first insulating layer 111 to cover the data lines DL. For the convenience of explanation, detailed descriptions of forming the gate line, the data lines, and the thin film transistor will be omitted.

Then, the first electrode EL1 is formed on the second insulating layer 113. The first electrode EL1 is formed of a transparent conductive material, such as indium tin oxide (ITO), indium zinc oxide (IZO), indium zinc tin oxide (IZTO), etc. The first electrode EL1 is formed by forming a first conductive layer over the entire surface of the second insulating layer 113 using the transparent conductive material and patterning the first conductive layer.

After that, the third insulating layer 115 is formed on the second insulating layer 113 to cover the first electrode EL1. The third insulating layer 115 is formed of an inorganic insulating material, such as silicon nitride (SiNx), silicon oxide (SiOx), etc.

Referring to FIG. 4E, a sacrificial layer SCR is formed on the third insulating layer 115 using an organic polymer material, e.g., an organic material containing benzocyclobutene (BCB) and acryl-based resin, but it should not be limited thereto or thereby.

The sacrificial layer SCR is removed later to form the tunnel-shaped cavity TSC, and thus the sacrificial layer SCR is formed in an area in which the image display part DSP is formed. Therefore, the sacrificial layer SCR is formed to have a width and a height, which respectively correspond to the width and the height of the image display part DSP.

Then, the fourth insulating layer 117, the second electrode EL2, the black matrix BM, the color filters CF, and the fifth insulating layer 119 are formed on the insulating substrate 110 on which the sacrificial layer SCR is formed.

The black matrix BM is formed by depositing a light blocking material on the second electrode EL2 and patterning the light blocking material. The black matrix BM is formed between the pixels.

The color filters CF are formed to cover the second electrode EL2. The color filters CF include the red color filter R, the green color filter G, and the blue color filter B and are formed of an organic polymer material, e.g., a photosensitive polymer material. The color filters CF are formed by an inkjet printing method.

The fourth insulating layer 117, the fifth insulating layer 119, and the second electrode EL2 may be formed by a photolithography process using one mask. Although not shown in figures, a portion of an upper surface of the sacrificial layer SCR is exposed through the photolithography process.

Referring back to FIG. 3, the fifth insulating layer 119 is formed to cover the both side surfaces of the color filters CF. The fifth insulating layer 119 protects the color filters CF, which is formed of the organic material, from being etched by the following process.

Referring to FIG. 4F, the sacrificial layer SCR is removed to form the tunnel-shaped cavity TSC. The sacrificial layer SCR is removed by a wet etch process or a plasma process. The sacrificial layer SCR is sequentially etched from the exposed upper surface thereof to an inner portion of the tunnel-shaped cavity TSC.

Although not shown in figures, an alignment layer is formed in the tunnel-shaped cavity TSC from which the sacrificial layer SCR is removed. The alignment layer is formed using an alignment material.

Then, the image display part DSP including the liquid crystals is formed in the tunnel-shaped cavity TSC. The liquid crystals are provided in a fluid form, and thus the liquid crystals flows into the tunnel-shaped cavity TSC due to a capillary phenomenon when the liquid crystals are provided to an area near to the tunnel-shaped cavity TSC. The liquid crystals may be provided to the area near to the tunnel-shaped cavity TSC by an inkjet using micropipette. In addition, the liquid crystals may be provided into the tunnel-shaped cavity TSC using a vacuum injection device.

After that, the liquid crystals that remain on the outer portion of the tunnel-shaped cavity TSC are removed, and then the protective layer PRT is formed. The protective layer PRT seals the opening of the tunnel-shaped cavity TSC, through which the liquid crystals are injected.

The protective layer PRT may be formed of a semi-cured polymer material.

Although not shown in figures, after the protective layer PRT is formed, the first polarizing plate and the second polarizing plate are respectively formed on the lower surface of the insulating substrate 110 and the upper surface of the protective layer PRT. The first polarizing plate has the polarizing axis substantially perpendicular to the polarizing axis of the second polarizing plate.

Figure 5:
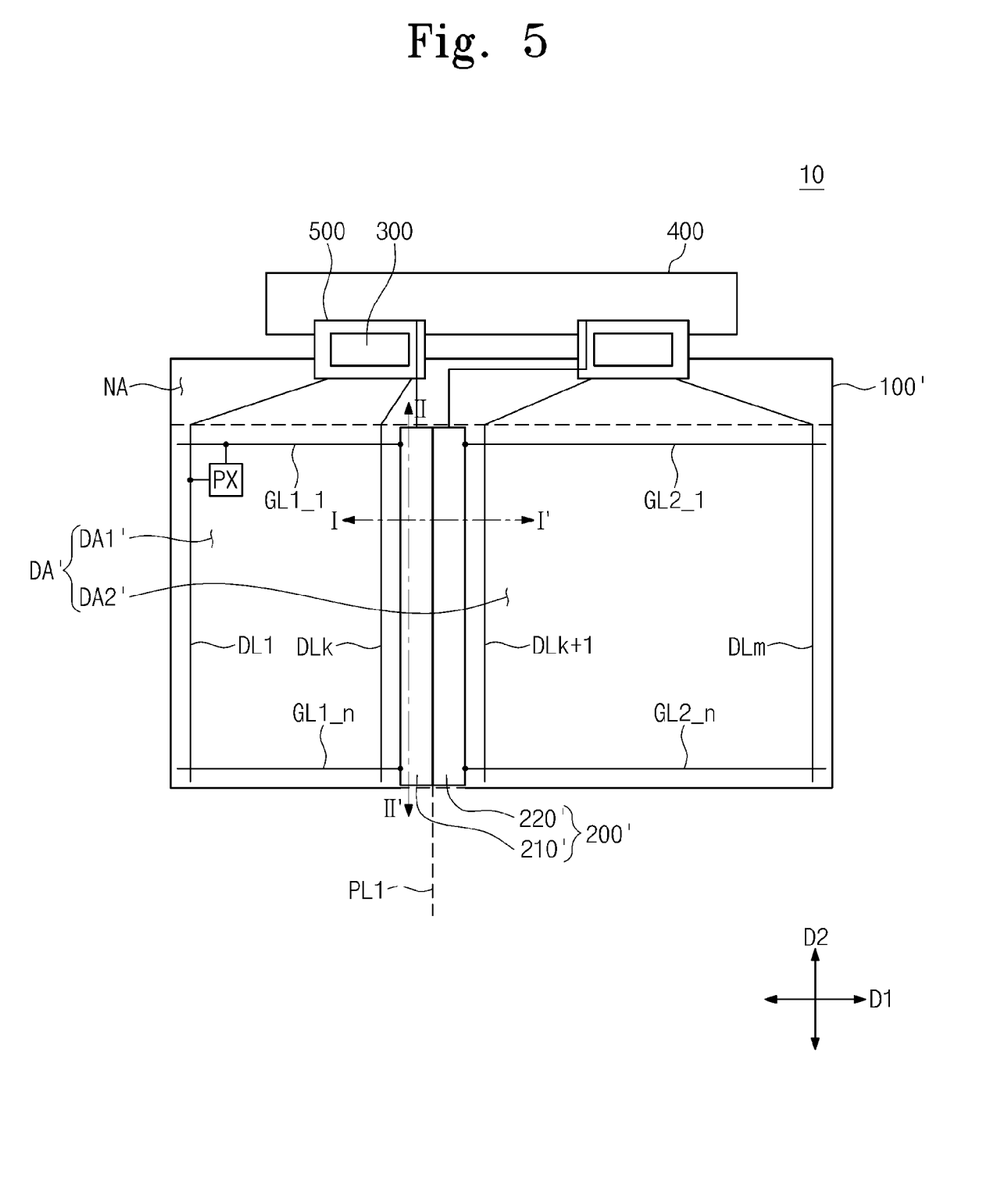
FIG. 5 is a plan view showing a display apparatus according to another exemplary embodiment of the present invention.

FIG. 5 is a plan view showing a display apparatus according to another exemplary embodiment of the present invention. In FIG. 5, the display apparatus have the same structure and function as those of the display apparatus described with reference to FIG. 1 except for the position of the gate driver and the areas of the first and second display areas. Thus, differences between the display apparatus in FIG. 5 and the display apparatus in FIG. 1 will be mainly described.

Referring to FIG. 5, a first display area DA1' and a second display area DA2' may be separately from each other with reference to a boundary line PL1 substantially in parallel with the second direction D2. In this case, the boundary line PL1 is positioned at a left portion or a right portion of a display panel 100' with respect to a center portion of the display panel 100'. In FIG. 5, the boundary line PL1 is positioned at the left portion of the display panel 100' with respect to the center portion of the display panel 100'. The first display area DA1' has an extent smaller than that of the second display area DA2'.

The gate driver 200' is disposed to overlap with a portion of the first display area DA1' and a portion of the second display area DA2'. In detail, a first gate driver 210' is overlapped with the first display area DA1' and a second gate driver 220' is overlapped with the second display area DA2'. That is, the gate driver 200' is located at the left portion of the display panel 100' with reference to the center portion of the display panel 100'.

Figure 6:
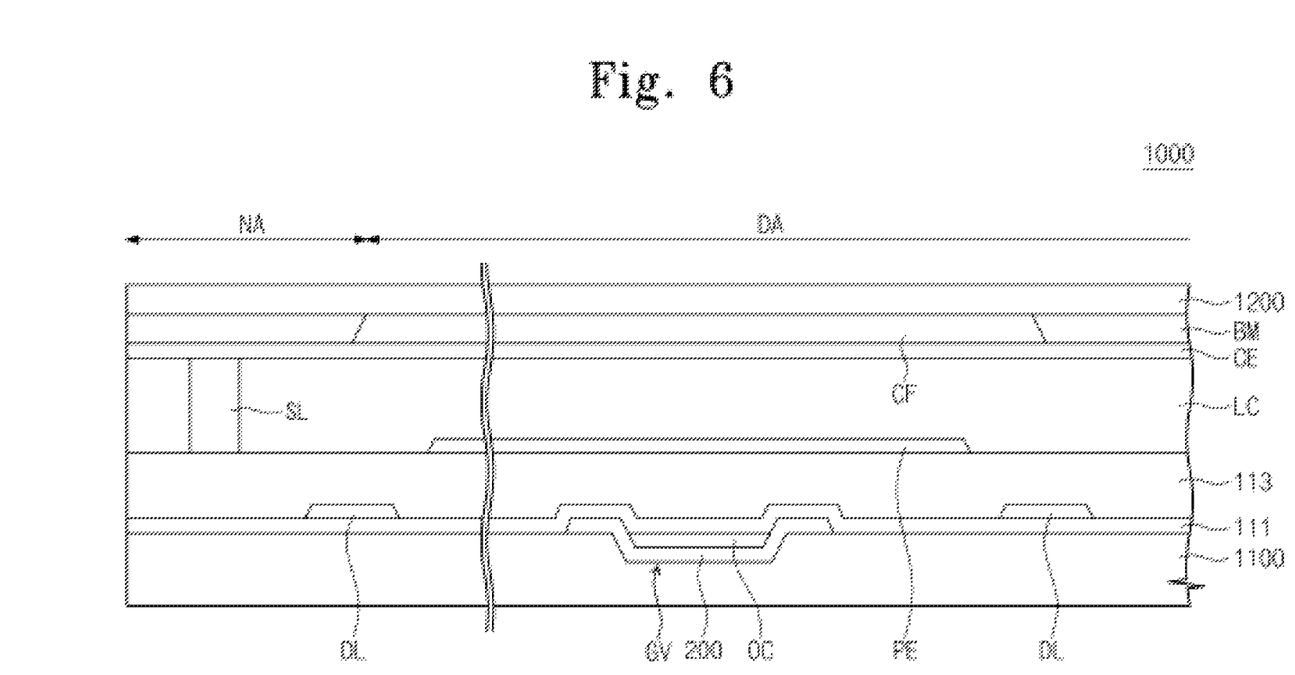
FIG. 6 is a cross-sectional view showing a display panel of a display apparatus according to another exemplary embodiment of the present invention.

FIG. 6 is a cross-sectional view showing a display panel of a display apparatus according to another exemplary embodiment of the present invention. In FIG. 6, the same reference numerals denote the same elements in FIG. 2, and thus detailed descriptions of the same elements will be omitted.

Referring to FIG. 6, the gate driver 200 is disposed to overlap with a display area DA of a display panel 1000.

The display panel 1000 includes a lower substrate 1100, an upper substrate 1200 facing the lower substrate 1100, and an image display layer LC interposed between the lower substrate 100 and the upper substrate 1200.

The gate driver 200, a thin film transistor, and a first pixel electrode PE are disposed on the lower substrate 1100.

A color filter CF and a second electrode CE are disposed on the upper substrate 1200.

The image display layer LC may be a liquid crystal layer. The image display layer LC is disposed between the lower substrate 1100 and the upper substrate 1200 to correspond to the display area DA.

The lower substrate 1100 and the upper substrate 1200 are coupled with each other using sealant SL. Due to the sealant SL, a space between the lower substrate 1100 and the upper substrate 1200 is sealed.

According to the present exemplary embodiment, the gate driver 200 is disposed to overlap with the display area DA, and thus the extent of the non-display area NA may be reduced when compared to that in the case that the gate driver 200 is disposed in the non-display area NA.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a display panel comprising a display area in which an image is displayed and a non-display area disposed adjacent to the display area, a pixel within the display area, a gate line contacting the pixel and extended in a first direction, a data line contacting the pixel and extended in a second direction crossing the first direction,
   wherein the image is configured to be displayed over the gate driver when viewed in a plan view,
   a gate driver configured to apply a gate signal to the gate line; and
   a data driver configured to apply a data signal to the data line,
   wherein the display panel further comprises:
   an insulating substrate comprising a groove extended in the second direction and
   overlapped with the display area when viewed in a plan view such that the gate driver is disposed at least partially in the groove; and
   an insulating planarization layer disposed on the gate driver and facing the groove.

2. The display apparatus of claim 1, wherein the insulating planarization layer has a thickness equal to or greater than 3 micrometers.

3. The display apparatus of claim 1, wherein the gate driver is transparent.

4. The display apparatus of claim 1, wherein the gate driver comprises a first portion disposed on the groove; and
   a second portion connected to the first portion and extended outwardly from the groove in the first direction.

5. The display apparatus of claim 4, wherein the groove is extended in the second direction.

6. The display apparatus of claim 4, wherein the display area comprises a first display area and a second display area, which are separated from each other with reference to a boundary line parallel to the second direction, and the gate line comprises:
   a first gate line disposed in the first display area; and
   a second gate line separated from the first gate line and disposed in the second display area.

7. The display apparatus of claim 6, wherein the gate driver comprises:
   a first gate driver connected to an end portion of the first gate line; and
   a second gate driver connected to an end portion of the second gate line, and the end portion of the first gate line faces the end portion of the second gate line.

8. The display apparatus of claim 6, wherein the first gate line has a same length in the first direction as a length of the second gate line in the first direction.

9. The display apparatus of claim 1, wherein the display panel further comprises:
   a first electrode disposed on the insulating substrate, the gate driver, and the insulating planarization layer;
   a second electrode disposed on the first electrode to be insulated from the first electrode and defining a tunnel-shaped cavity between the first electrode and the second electrode;
   an image display layer disposed in the tunnel-shaped cavity and controllable by an electric field generated between the first electrode and the second electrode; and
   a protective layer that covers the second electrode and seals the tunnel-shaped cavity.

10. The display apparatus of claim 1, wherein the display panel further comprises:
    a first electrode disposed on the insulating substrate, the gate driver, and the insulating planarization layer;
    an upper substrate facing the insulating substrate and comprising a second electrode; and
    an image display layer disposed between the insulating substrate and the upper substrate.

* * * * *